(12) United States Patent
Yang et al.

(10) Patent No.: US 7,277,688 B2
(45) Date of Patent: Oct. 2, 2007

(54) DC OFFSET CORRECTION FOR VERY LOW INTERMEDIATE FREQUENCY RECEIVER

(75) Inventors: Baoguo Yang, Iselin, NJ (US); Nelson R. Sollenberger, Farmingdale, NJ (US)

(73) Assignee: Broadcom Corporation, Irvine, CA (US)

( * ) Notice: Subject to any disclaimer, the term of this patent is extended or adjusted under 35 U.S.C. 154(b) by 577 days.

(21) Appl. No.: 10/811,579

(22) Filed: Mar. 29, 2004

(65) Prior Publication Data

US 2005/0009493 A1    Jan. 13, 2005

Related U.S. Application Data

(60) Provisional application No. 60/479,199, filed on Jun. 17, 2003.

(51) Int. Cl.
    *H04B 1/10* (2006.01)
(52) U.S. Cl. .............. 455/296; 455/313; 455/314; 455/63.1; 329/318; 329/320; 375/317; 375/319
(58) Field of Classification Search ............ 455/314, 455/424, 425, 456.5, 456.6, 561, 575.1, 550.1, 455/67.11, 63.1, 501, 552.1, 135, 278.1, 296, 455/310, 232, 334, 312, 283, 285, 295, 305, 455/307; 375/324, 350, 261, 284, 346, 316, 375/442, 347, 319, 322, 339, 373, 317, 326, 375/344, 345; 370/321, 337, 347, 348, 527, 370/529, 441, 350, 235, 341, 229; 329/318, 329/320, 349, 350, 353
See application file for complete search history.

(56) References Cited

U.S. PATENT DOCUMENTS 6,075,409 A *  6/2000  Khlat .................. 329/304
6,240,100 B1 *  5/2001  Riordan et al. ......... 370/442
6,442,383 B1 *  8/2002  Iemura ................. 455/312

(Continued)

FOREIGN PATENT DOCUMENTS

WO    WO94/29948    12/1994

(Continued)

*Primary Examiner*—Edward F. Urban
*Assistant Examiner*—Charles Chow
(74) *Attorney, Agent, or Firm*—Garlick Harrison & Markison; Bruce E. Garlick

(57) ABSTRACT

A wireless receiver includes a local oscillator, a mixer, a band pass filter, a DC offset determination module, a DC offset correction module, a subtraction module, and a down converter. The local oscillator produces a local oscillation that a mixer uses to down convert the RF information signal to produce a Very Low Intermediate Frequency (VLIF) information signal at a VLIF and having a DC offset. The band pass filter band pass filters the VLIF information signal. The DC offset determination module produces a DC offset indication for the VLIF information signal. The DC offset correction module generates a DC offset correction based upon the DC offset indication. The subtraction module subtracts the DC offset correction from the VLIF information signal to substantially remove a DC offset of the post-filtered VLIF information signal. The down converter down converts the VLIF information signal to a baseband information signal. In an alternate embodiment, the VLIF information signal is down converted to baseband prior to removal of the DC offset component, which then resides at –VLIF frequency.

21 Claims, 12 Drawing Sheets

U.S. PATENT DOCUMENTS

| | | | |
|---|---|---|---|
| 6,597,748 B1 * | 7/2003 | Hietala et al. | 375/324 |
| 6,673,340 B1 * | 1/2004 | Harrison et al. | 424/93.2 |
| 6,678,340 B1 * | 1/2004 | Khlat et al. | 375/350 |
| 6,711,393 B1 * | 3/2004 | Stenström et al. | 455/284 |
| 6,954,628 B2 * | 10/2005 | Minnis et al. | 455/324 |
| 7,076,225 B2 * | 7/2006 | Li et al. | 455/245.1 |
| 7,130,359 B2 * | 10/2006 | Rahman | 375/316 |
| 7,136,431 B2 * | 11/2006 | Shi et al. | 375/319 |
| 2002/0151289 A1 * | 10/2002 | Rahman et al. | 455/232.1 |
| 2002/0160738 A1 | 10/2002 | Allott et al. | |
| 2003/0060180 A1 | 3/2003 | Hall et al. | |
| 2003/0100286 A1 * | 5/2003 | Severson et al. | 455/324 |
| 2003/0148750 A1 * | 8/2003 | Yan et al. | 455/305 |
| 2004/0071238 A1 * | 4/2004 | Khlat et al. | 375/346 |
| 2004/0146120 A1 * | 7/2004 | Brown | 375/322 |
| 2006/0222117 A1 * | 10/2006 | Rahman et al. | 375/345 |

FOREIGN PATENT DOCUMENTS

| | | |
|---|---|---|
| WO | WO 02/30080 A1 | 4/2002 |
| WO | WO 03/028206 A1 | 4/2003 |

\* cited by examiner

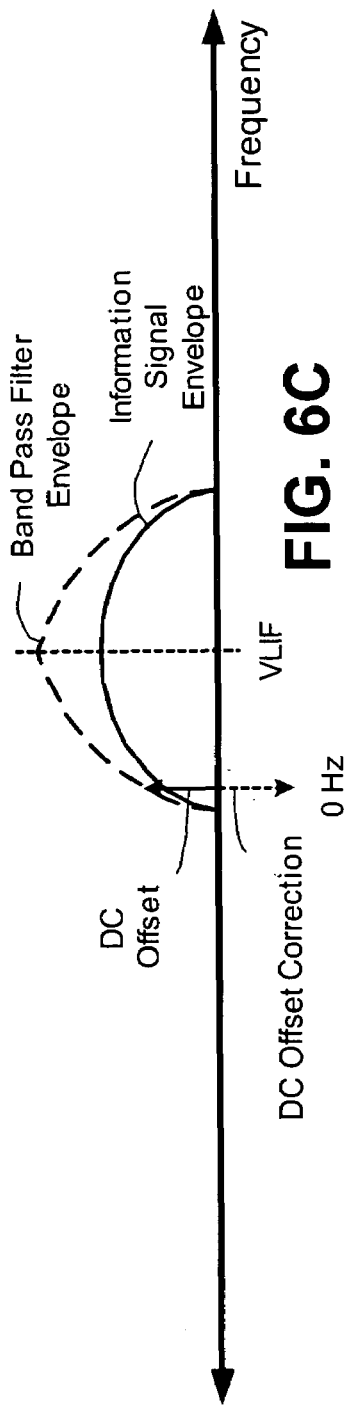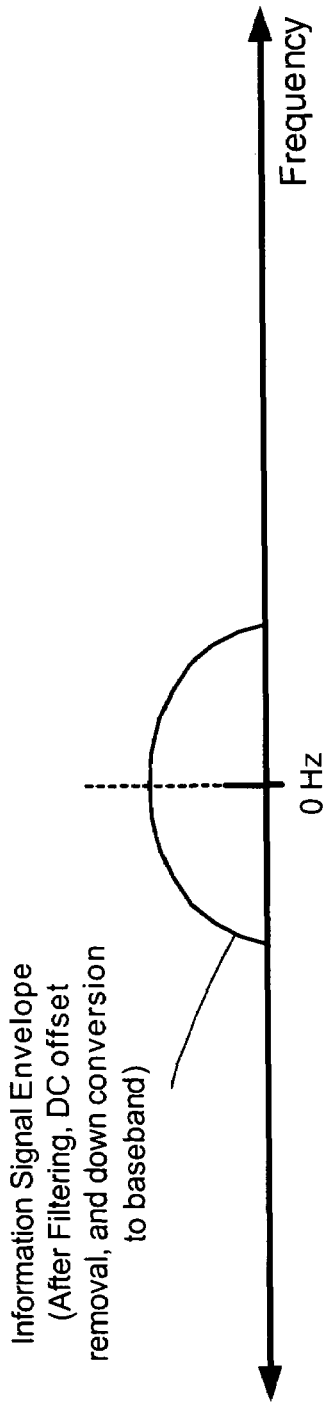

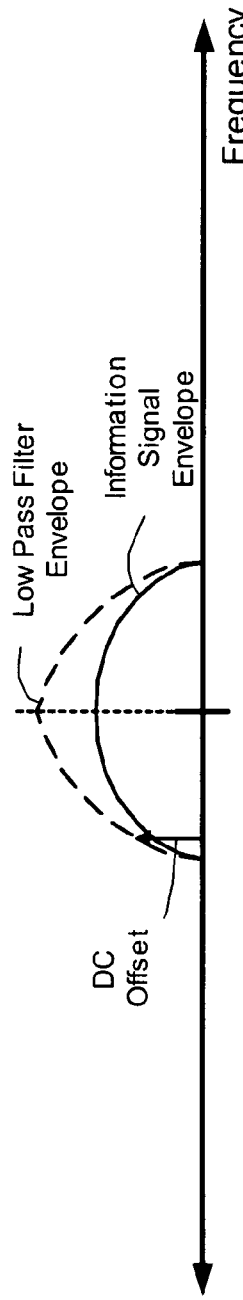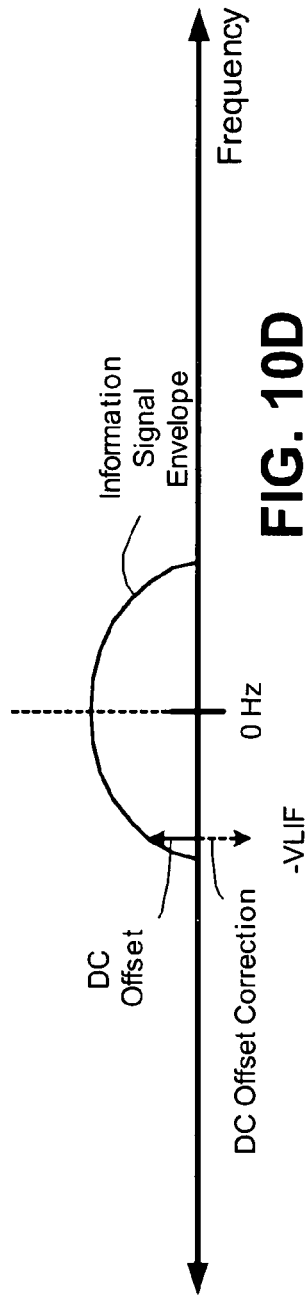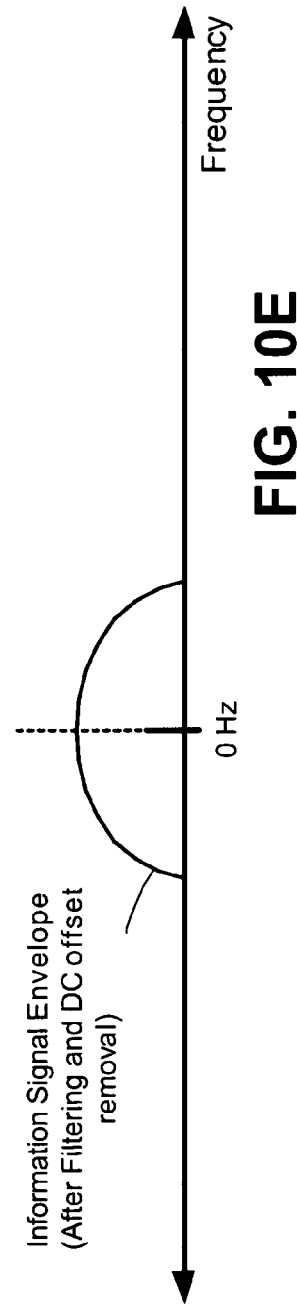

DC OFFSET CORRECTION FOR VERY LOW INTERMEDIATE FREQUENCY RECEIVER

CROSS REFERENCES TO RELATED APPLICATIONS

This application claims priority to U.S. Provisional Patent Application Ser. No. 60/479,199, filed Jun. 17, 2003, which is incorporated herein by reference for all purposes.

BACKGROUND

1. Technical Field

The present invention relates generally to cellular wireless communication systems; and more particularly to the processing of data communications received by a wireless receiver in such a cellular wireless communication system.

2. Related Art

Cellular wireless communication systems support wireless communication services in many populated areas of the world. While cellular wireless communication systems were initially constructed to service voice communications, they are now called upon to support data communications as well. The demand for data communication services has exploded with the acceptance and widespread use of the Internet. While data communications have historically been serviced via wired connections, cellular wireless users now demand that their wireless units also support data communications. Many wireless subscribers now expect to be able to "surf" the Internet, access their email, and perform other data communication activities using their cellular phones, wireless personal data assistants, wirelessly linked notebook computers, and/or other wireless devices. The demand for wireless communication system data communications will only increase with time. Thus, cellular wireless communication systems are currently being created/modified to service these burgeoning data communication demands.

Cellular wireless networks include a "network infrastructure" that wirelessly communicates with wireless terminals within a respective service coverage area. The network infrastructure typically includes a plurality of base stations dispersed throughout the service coverage area, each of which supports wireless communications within a respective cell (or set of sectors). The base stations couple to base station controllers (BSCs), with each BSC serving a plurality of base stations. Each BSC couples to a mobile switching center (MSC). Each BSC also typically directly or indirectly couples to the Internet.

In operation, each base station communicates with a plurality of wireless terminals operating in its cell/sectors. A BSC coupled to the base station routes voice communications between the MSC and the serving base station. The MSC routes the voice communication to another MSC or to the PSTN. BSCs route data communications between a servicing base station and a packet data network that may include or couple to the Internet. Transmissions from base stations to wireless terminals are referred to as "forward link" transmissions while transmissions from wireless terminals to base stations are referred to as "reverse link" transmissions. The volume of data transmitted on the forward link typically exceeds the volume of data transmitted on the reverse link. Such is the case because data users typically issue commands to request data from data sources, e.g., web servers, and the web servers provide the data to the wireless terminals.

Wireless links between base stations and their serviced wireless terminals typically operate according to one (or more) of a plurality of operating standards. These operating standards define the manner in which the wireless link may be allocated, setup, serviced and torn down. One popular cellular standard is the Global System for Mobile telecommunications (GSM) standard. The GSM standard, or simply GSM, is predominant in Europe and is in use around the globe. While GSM originally serviced only voice communications, it has been modified to also service data communications. GSM General Packet Radio Service (GPRS) operations and the Enhanced Data rates for GSM (or Global) Evolution (EDGE) operations coexist with GSM by sharing the channel bandwidth, slot structure, and slot timing of the GSM standard. The GPRS operations and the EDGE operations may also serve as migration paths for other standards as well, e.g., IS-136 and Pacific Digital Cellular (PDC).

In order for EDGE to provide increased data rates within a 200 KHz GSM channel, it employs a higher order modulation, 8-PSK (octal phase shift keying), in addition to GSM's standard Gaussian Minimum Shift Keying (GMSK) modulation. EDGE allows for nine different (autonomously and rapidly selectable) air interface formats, known as Modulation and Coding schemes (MCSs), with varying degrees of error control protection. Low MCS modes, (MCS 1-4) use GMSK (low data rate) while high MCS modes (MCS 5-9) use 8-PSK (high data rate) modulation for over the air transmissions, depending upon the instantaneous demands of the application and the operating conditions.

A typical wireless device, e.g., hand held wireless device, that supports these operations typically includes at least a baseband processor and a Radio Frequency (RF) front end among other components. The baseband processor and RF front end often times reside on differing integrated circuits. The baseband processor provides a digital interface to other components and also provides an analog interface to the RF front end. For transmit operations, the baseband processor receives digital information for transmission and creates a baseband (or low Intermediate Frequency (IF)) signal that carries the digital information. The RF front end receives the baseband signal, up converts the baseband signal to an RF signal, and provides the RF signal to an antenna for transmission. For receive operations, the RF front end receives an RF signal from the antenna and down converts the RF signal to a baseband (or low IF) signal. The baseband processor receives the baseband (or low IF) signal and extracts digital information from the baseband signal.

In order to support high data rate operations, e.g., GPRS, EDGE, etc., the RF front end and baseband processor must meet strict operating conditions. One such operating condition requires that the RF front end and baseband processor correctly extract digital information from relatively weak received RF signals. In meeting this condition, the baseband signal produced by the RF front end to the baseband processor must be of high quality, which requires that the RF front end perform its amplification, filtering, and down conversion operations without degrading the signal. Most RF front ends, however, introduce significant DC offset into the baseband signal. Some RF front ends may produce a baseband signal having more DC offset than a weak information signal contained therewith.

Typical Super heterodyne RF front ends generate residual DC offsets of 100s of millivolts in baseband signals that they produce. Typical Direct Conversion RF front ends generate residual DC offsets of 100's of millivolts in baseband signals that they produce. RF front ends that produce a Very Low IF (VLIF) signal typically produce less DC offset than do Super heterodyne RF front ends. However, VLIF RF front ends typically place very high attenuation at the VLIF, e.g., 100

KHz, to suppress DC components prior to de-rotation, which disrupts demodulation operations. Because residual DC offset produced by an RF front end is typically independent between frames, removal by a servicing baseband processor is difficult. In servicing higher order modulations, final uncorrected DC offset residuals must be no greater than −20 dB relative to the signal for a GMSK burst and preferably no greater than −35 dB relative to the signal for 8-PSK. Thus a need exists for a wireless receiver that meets these stringent DC offset performance criteria.

BRIEF SUMMARY OF THE INVENTION

In order to overcome these shortcomings of the prior devices, among others, a wireless receiver operating according to an embodiment of the present invention down converts a Radio Frequency (RF) information signal to a baseband information signal. The wireless receiver includes a local oscillator, a mixer, a band pass filter, a DC offset determination module, a DC offset correction module, a subtraction module, and a down converter. The local oscillator is operable to produce a local oscillation. The mixer is operable to mix the RF information signal with the local oscillation to down convert the RF information signal to produce a Very Low Intermediate Frequency (VLIF) information signal at a VLIF and having a DC offset. The band pass filter is operable to band pass filter the VLIF information signal. The DC offset determination module is operable to produce a DC offset indication for the VLIF information signal. The DC offset correction module is operable to generate a DC offset correction based upon the DC offset indication. The subtraction module is operable to subtract the DC offset correction from the VLIF information signal to substantially remove a DC offset of the post-filtered VLIF information signal. The down converter is operable to down convert the VLIF information signal to a baseband information signal.

In one particular construct and operation, the VLIF is approximately 100 kHz. In other embodiments, however, the VLIF may be higher, e.g., 150 kHz, or lower, e.g., less than 100 kHz. Typically, the DC offset in the VLIF information signal is unintentionally introduced by at least one of an amplifier, a filter, and the mixer and must be removed by the DC offset removing components.

In operation, the DC offset determination module produces the DC offset indication by averaging the VLIF information signal across a full RF burst. The full RF burst may carry a portion of one of a GPRS data packet or an EDGE data packet. When servicing an EDGE data packet the full RF burst may be modulated according to either a GMSK or an 8-PSK constellation. When servicing a GPRS data packet, the full RF burst is modulated according to the GMSK constellation.

In some embodiments, the components of the wireless receiver are divided between an RF front end and a baseband processor. In such case, an Analog to Digital converter (ADC) converts the VLIF information signal from an analog signal produced by the RF front end to a digital signal operated upon by the baseband processor. The ADC may be located in the RF front end, in the baseband processor, or between the RF front end and the baseband processor. With this split in the structure of the wireless receiver, the local oscillator and the mixer reside within the RF front end while the band pass filter, the DC offset determination module, the DC offset correction module, the subtraction module, and the down converter are implemented by the baseband processor.

In an alternate embodiment, the VLIF information signal is down converted to baseband prior to removal of the DC offset component, which then resides at −VLIF frequency. This alternate embodiment includes both structural components and method steps to implement the differing operations required therein. In such case, the band pass filter is not employed and a low pass filter is employed instead to filter the baseband information signal.

Other features and advantages of the present invention will become apparent from the following detailed description of the invention made with reference to the accompanying drawings.

BRIEF DESCRIPTION OF THE DRAWINGS

FIG. 6C is a frequency plot illustrating the spectrum of the VLIF information signal after band pass filtering and showing in detail how DC offset is removed according to the embodiment of FIG. 5;

FIG. 6D is a frequency plot illustrating the spectrum of the baseband information signal of FIG. 6C after removal of the DC offset according to the embodiment of FIG. 5;

FIG. 10C is a frequency plot illustrating the spectrum of a Baseband Information signal after low pass filtering according to the embodiment of FIG. 8;

FIG. 10D is a frequency plot illustrating DC removal of the tone at −IF frequency according to the embodiment of FIG. 8; and FIG. 10E is a frequency plot illustrating the spectrum of the baseband information signal of FIG. 10D after removal of the DC offset according to the embodiment of FIG. 8.

DETAILED DESCRIPTION OF THE DRAWINGS

Figure 1:
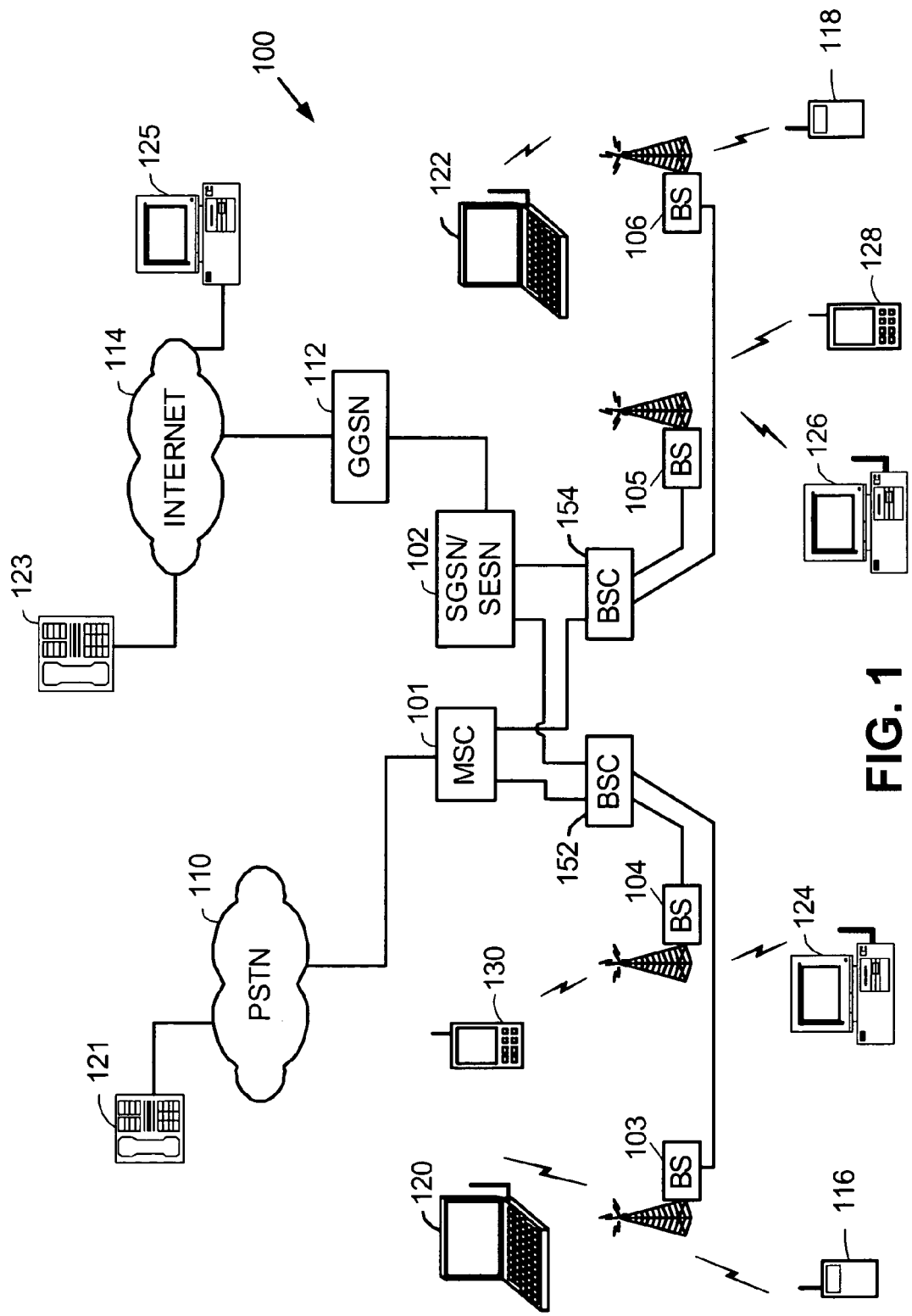
FIG. 1 is a system diagram illustrating a portion of a cellular wireless communication system that supports wireless terminals operating according to the present invention.

FIG. 1 is a system diagram illustrating a portion of a cellular wireless communication system 100 that supports wireless terminals operating according to the present invention. The cellular wireless communication system 100 includes a Mobile Switching Center (MSC) 101, Serving GPRS Support Node/Serving EDGE Support Node (SGSN/SESN) 102, base station controllers (BSCs) 152 and 154, and base stations 103, 104, 105, and 106. The SGSN/SESN 102 couples to the Internet 114 via a GPRS Gateway Support Node (GGSN) 112. A conventional voice terminal 121 couples to the PSTN 110. A Voice over Internet Protocol (VoIP) terminal 123 and a personal computer 125 couple to the Internet 114. The MSC 101 couples to the Public Switched Telephone Network (PSTN) 110.

Each of the base stations 103-106 services a cell/set of sectors within which it supports wireless communications. Wireless links that include both forward link components and reverse link components support wireless communications between the base stations and their serviced wireless terminals. These wireless links support digital data communications, VoIP communications, and other digital multimedia communications. The cellular wireless communication system 100 may also be backward compatible in supporting analog operations as well. The cellular wireless communication system 100 supports the Global System for Mobile telecommunications (GSM) standard and also the Enhanced Data rates for GSM (or Global) Evolution (EDGE) extension thereof. The cellular wireless communication system 100 may also support the GSM General Packet Radio Service (GPRS) extension to GSM. However, the present invention is also applicable to other standards as well, e.g., TDMA standards, CDMA standards, etc. In general, the teachings of the present invention apply to digital communications that combine Automatic Repeat ReQuest (ARQ) operations at Layer 2, e.g., LINK/MAC layer with variable coding/decoding operations at Layer 1 (PHY).

Wireless terminals 116, 118, 120, 122, 124, 126, 128, and 130 couple to the cellular wireless communication system 100 via wireless links with the base stations 103-106. As illustrated, wireless terminals may include cellular telephones 116 and 118, laptop computers 120 and 122, desktop computers 124 and 126, and data terminals 128 and 130. However, the cellular wireless communication system 100 supports communications with other types of wireless terminals as well. As is generally known, devices such as laptop computers 120 and 122, desktop computers 124 and 126, data terminals 128 and 130, and cellular telephones 116 and 118, are enabled to "surf" the Internet 114, transmit and receive data communications such as email, transmit and receive files, and to perform other data operations. Many of these data operations have significant download data-rate requirements while the upload data-rate requirements are not as severe. Some or all of the wireless terminals 116-130 are therefore enabled to support the EDGE operating standard. These wireless terminals 116-130 also support the GSM standard and may support the GPRS standard.

Figure 2:
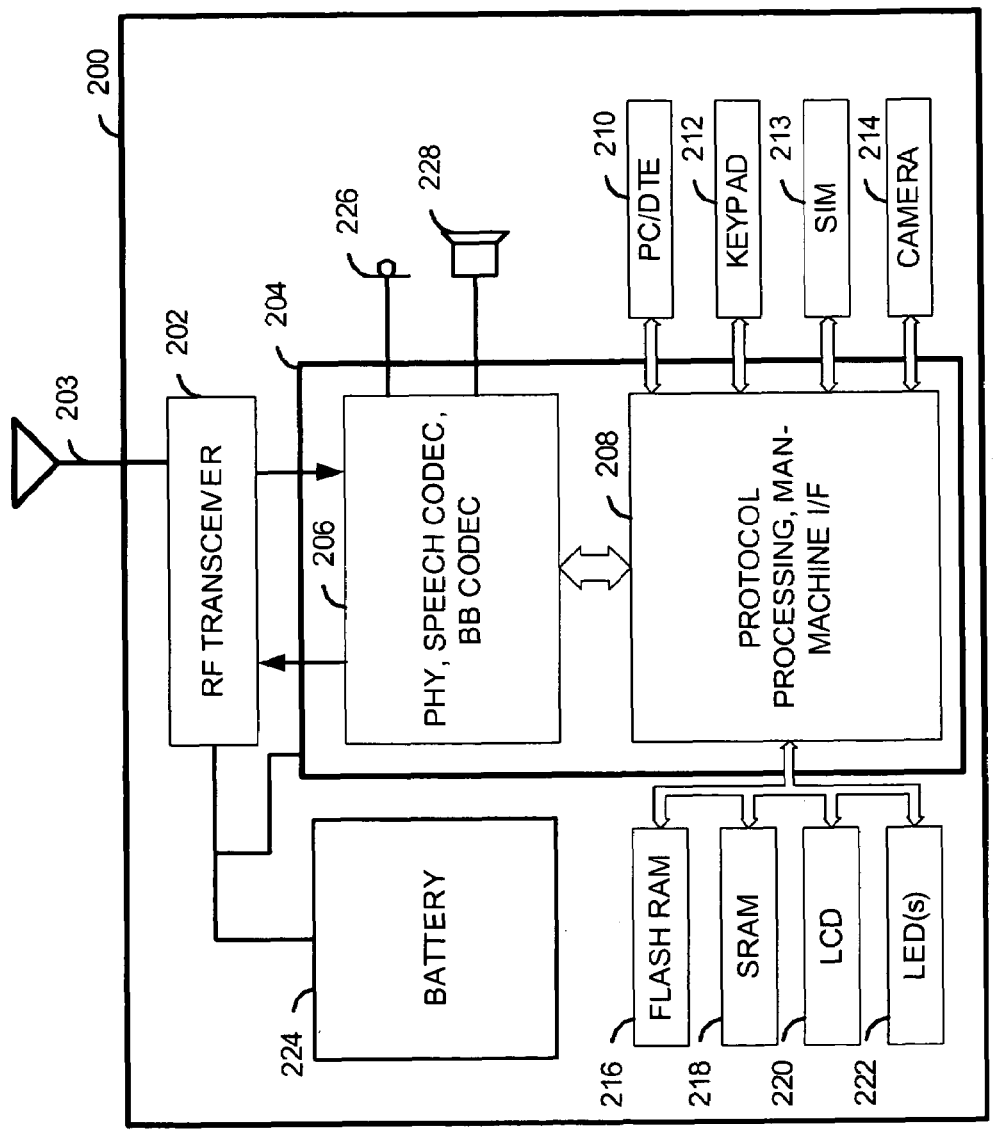
FIG. 2 is a block diagram functionally illustrating a wireless terminal constructed according to the present invention.

FIG. 2 is a block diagram functionally illustrating a wireless terminal 200 constructed according to the present invention. The wireless terminal 200 of FIG. 2 includes an RF transceiver 202, digital processing components 204, and various other components contained within a housing. The digital processing components 204 includes two main functional components, a physical layer processing, speech COder/DECoder (CODEC), and baseband CODEC functional block 206 and a protocol processing, man-machine interface functional block 208. A Digital Signal Processor (DSP) is the major component of the physical layer processing, speech COder/DECoder (CODEC), and baseband CODEC functional block 206 while a microprocessor, e.g., Reduced Instruction Set Computing (RISC) processor, is the major component of the protocol processing, man-machine interface functional block 208. The DSP may also be referred to as a Radio Interface Processor (RIP) while the RISC processor may be referred to as a system processor. However, these naming conventions are not to be taken as limiting the functions of these components.

The RF transceiver 202 couples to an antenna 203, to the digital processing components 204, and also to a battery 224 that powers all components of the wireless terminal 200. The physical layer processing, speech COder/DECoder (CODEC), and baseband CODEC functional block 206 couples to the protocol processing, man-machine interface functional block 208 and to a coupled microphone 226 and speaker 228. The protocol processing, man-machine interface functional block 208 couples to a Personal Computing/Data Terminal Equipment interface 210, a keypad 212, a Subscriber Identification Module (SIM) port 213, a camera 214, a flash RAM 216, an SRAM 218, a LCD 220, and LED(s) 222. The camera 214 and LCD 220 may support either/both still pictures and moving pictures. Thus, the wireless terminal 200 of FIG. 2 supports video services as well as audio services via the cellular network.

Figure 3:
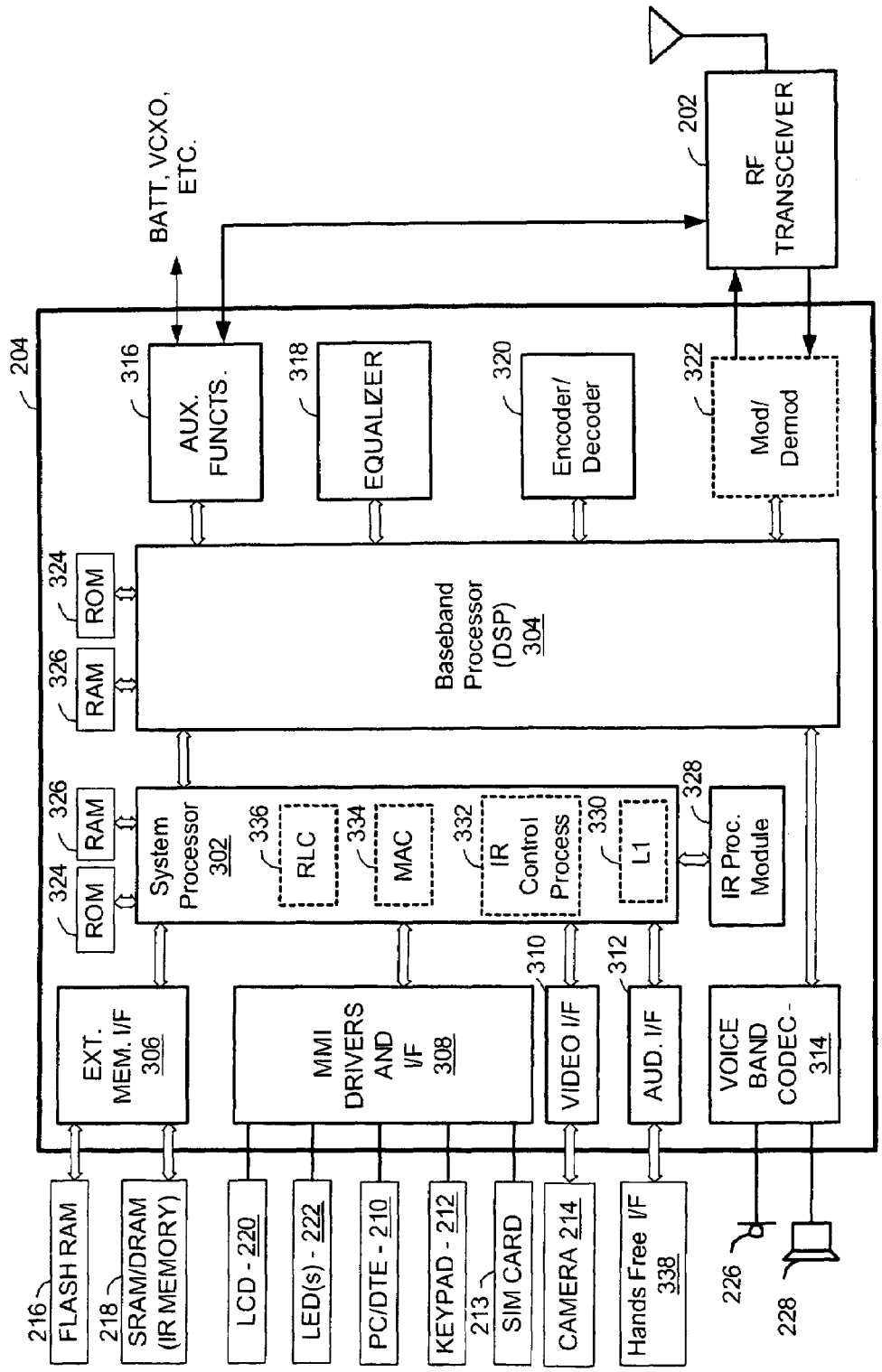
FIG. 3 is a block diagram illustrating in more detail the wireless terminal of FIG. 2, with particular emphasis on the digital processing components of the wireless terminal.

FIG. 3 is a block diagram illustrating in more detail the wireless terminal of FIG. 2, with particular emphasis on the digital processing components of the wireless terminal. The digital processing components 204 include a system processor 302, a baseband processor 304, and a plurality of supporting components. The supporting components include an external memory interface 306, MMI drivers and I/F 308, a video I/F 310, an audio I/F 312, a voice band CODEC 314, auxiliary functions 316, a modulator/demodulator 322, ROM 324, RAM 326 and a plurality of processing modules. In some embodiments, the modulator/demodulator 322 is not a separate structural component with these functions being performed internal to the baseband processor 304.

The processing modules are also referred to herein as accelerators, co-processors, processing modules, or otherwise, and include auxiliary functions 316, an equalizer 318, an encoder/decoder 320, and an Incremental Redundancy (IR) processing module 328. The interconnection of FIG. 3 is one example of a manner in which these components may be interconnected. Other embodiments support additional/alternate couplings. Such coupling may be direct, indirect, and/or may be via one or more intermediary components.

RAM and ROM service both the system processor 302 and the baseband processor 304. Both the system processor 302 and the baseband processor 304 may couple to shared RAM 326 and ROM 324, couple to separate RAM, coupled to separate ROM, couple to multiple RAM blocks, some shared, some not shared, or may be served in a differing manner by the memory. In one particular embodiment, the system processor 302 and the baseband processor 304 coupled to respective separate RAMs and ROMs and also couple to a shared RAM that services control and data transfers between the devices. The processing modules 316, 318, 320, 322, and 328 may coupled as illustrated in FIG. 3 but may also coupled in other manners as well.

The system processor 302 services at least a portion of a serviced protocol stack, e.g., GSM/GPRS/EDGE protocol stack. In particular the system processor 302 services Layer 1 (L1) operations 330, a portion of Incremental Redundancy (IR) GSM protocol stack operations 332 (referred to as "IR control process"), Medium Access Control (MAC) operations 334, and Radio Link Control (RLC) operations 336. These operations will not be further described herein except as how they relate to the present invention. The baseband processor 304 in combination with the modulator/demodulator 322, RF transceiver, equalizer 318, and/or encoder/decoder 320 service the Physical Layer (PHY) operations performed by the digital processing components 204.

As is known, EDGE supports both selective repeat Type I ARQ operations and IR Type II ARQ operations for data protection. With IR operations, when a first transmitted data block is in error, a re-transmitted data block will be sent. The re-transmitted data block may have a same coding/puncturing pattern or a differing coding/puncturing pattern as compared to the first data block. Soft combining of the data blocks is performed and decoding and error checking of the combined data block (de-punctured) is then attempted. Multiple retransmission/combining/decoding operations may be attempted before the IR process terminates. IR operations are successful as compared to simple retransmissions because coding schemes/puncturing patterns of each transmission are complementary to one other.

Figure 4:
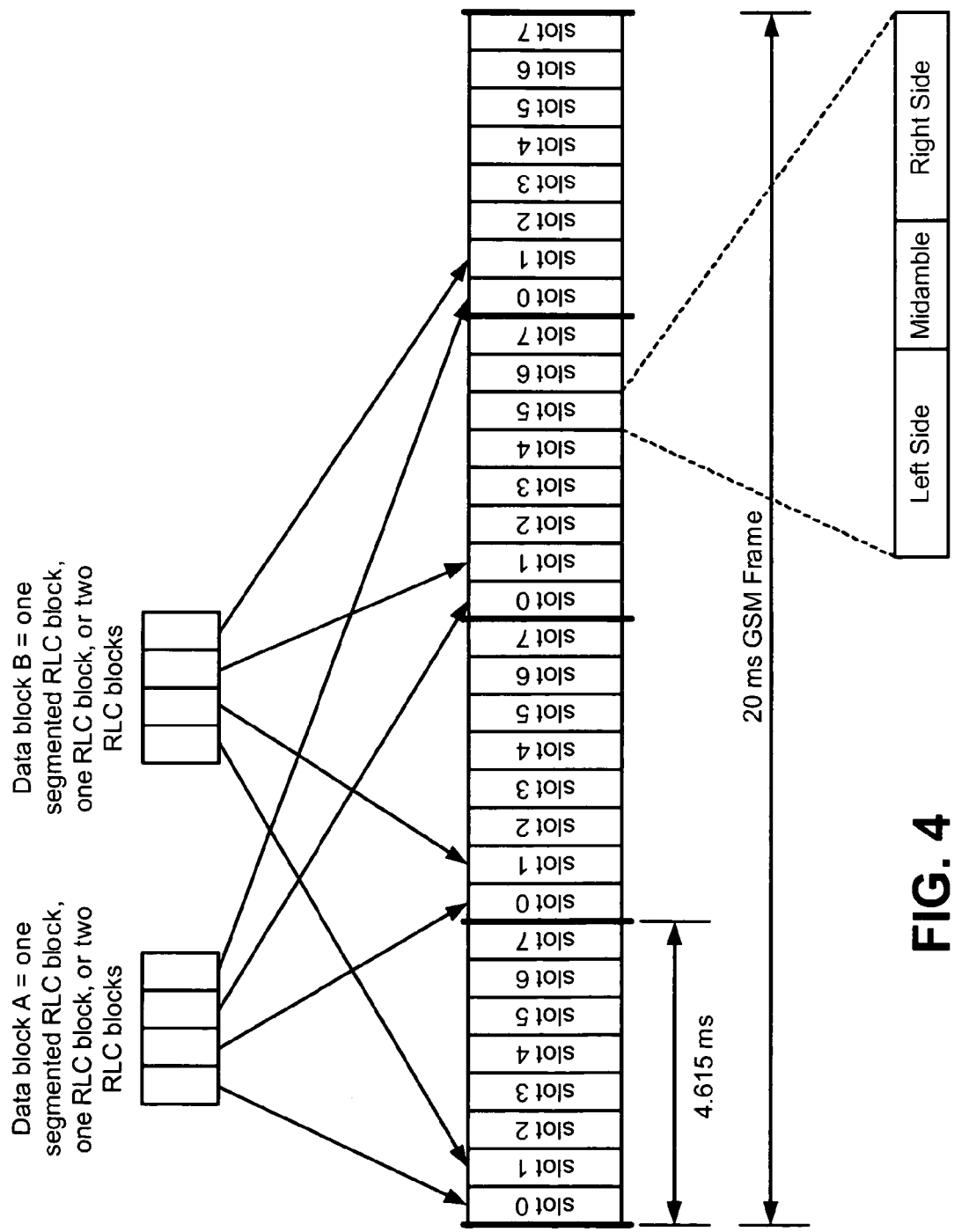
FIG. 4 is a block diagram illustrating the general structure of a GSM frame and the manner in which data blocks are carried by the GSM frame.

FIG. 4 is a block diagram illustrating the general structure of a GSM frame and the manner in which data blocks are carried by the GSM frame. The GSM frame is 20 ms in duration, is divided into quarter frames, each of which includes eight time slots, time slots 0 through 7. Each time slot is approximately 625 us in duration, includes a left side, a right side, and a midamble. The left side and right side of an RF burst of the time slot carry data while the midamble is a training sequence.

The RF bursts of four time slots of the GSM frame carry a segmented RLC block, a complete RLC block, or two RLC blocks, depending upon a supported Modulation and Coding Scheme (MCS) mode. For example, data block A is carried in slot 0 of quarter frame 1, slot 0 of quarter frame 2, slot 0 of quarter frame 3, and slot 0 of quarter frame 3. Data block A may carry a segmented RLC block, an RLC block, or two RLC blocks. Likewise, data block B is carried in slot 1 of quarter frame 1, slot 1 of quarter frame 2, slot 1 of quarter frame 3, and slot 1 of quarter frame 3. The MCS mode of each set of slots, i.e., slot n of each quarter frame, for the GSM frame is consistent for the GSM frame but may vary from GSM frame to GSM frame. Further, the MCS mode of differing sets of slots of the GSM frame, e.g., slot 0 of each quarter frame vs. any of slots 1-7 of each quarter frame, may differ.

Figure 5:
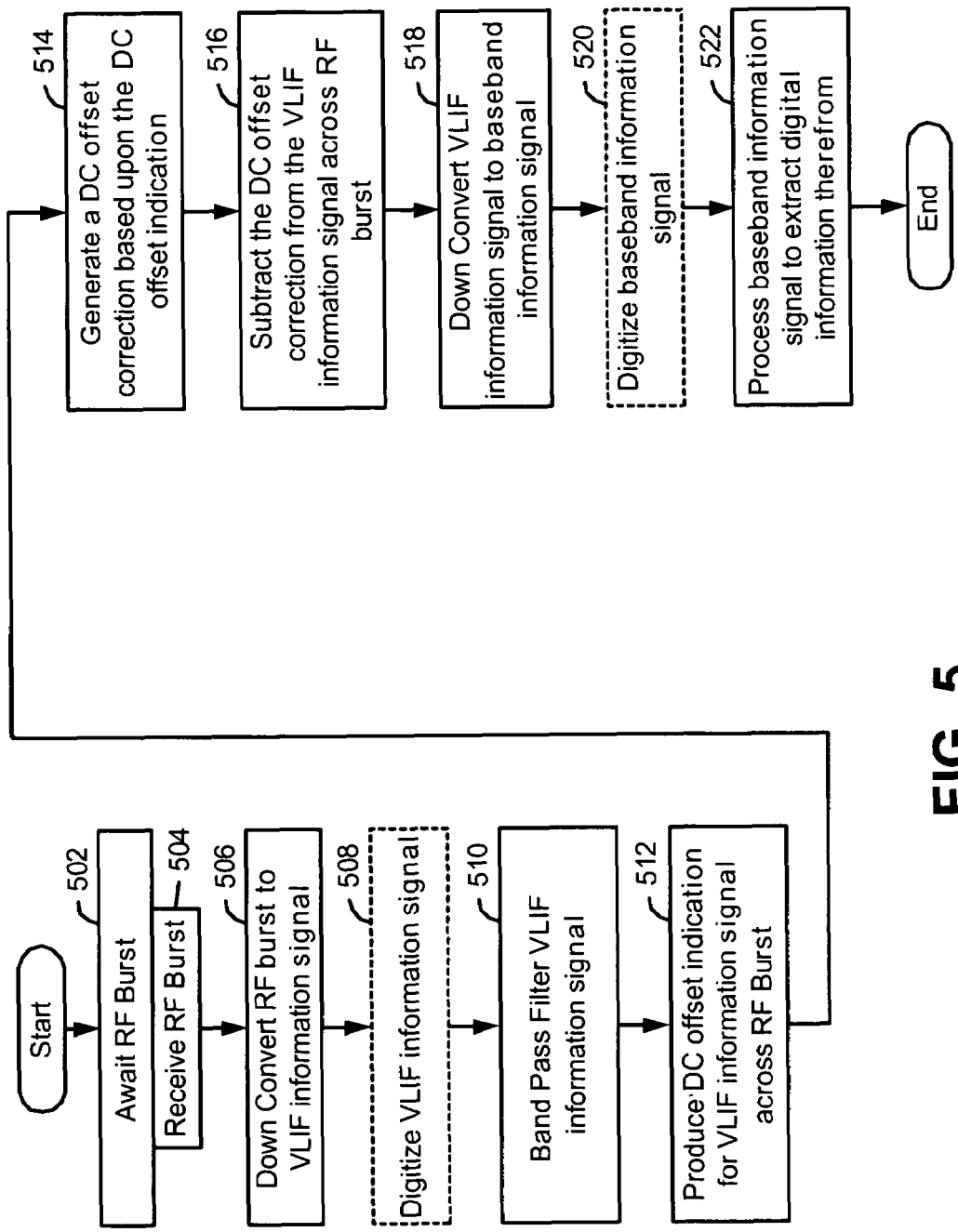
FIG. 5 is a logic diagram illustrating a method for down converting a Radio Frequency (RF) information signal to a baseband information signal according to a first embodiment the present invention.
Figure 6A:
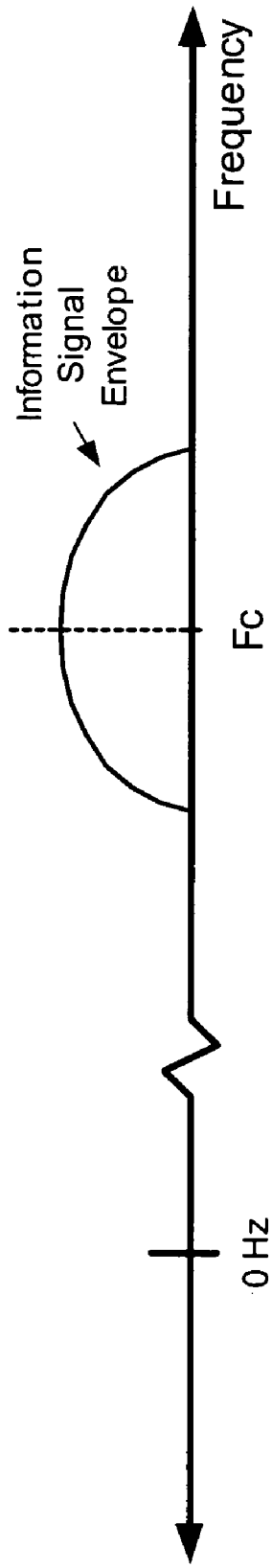
FIG. 6A is a frequency plot illustrating the spectrum of an RF signal operated upon according to the present invention.
Figure 6B:
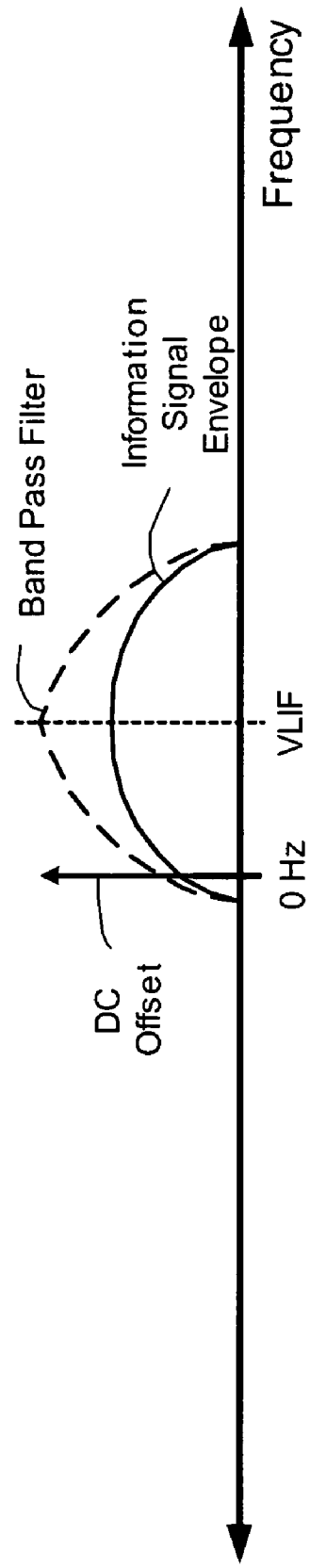
FIG. 6B is a frequency plot illustrating the spectrum of a Very Low Intermediate Frequency (VLIF) information signal produced according to the embodiment of FIG. 5.
Figure 7:
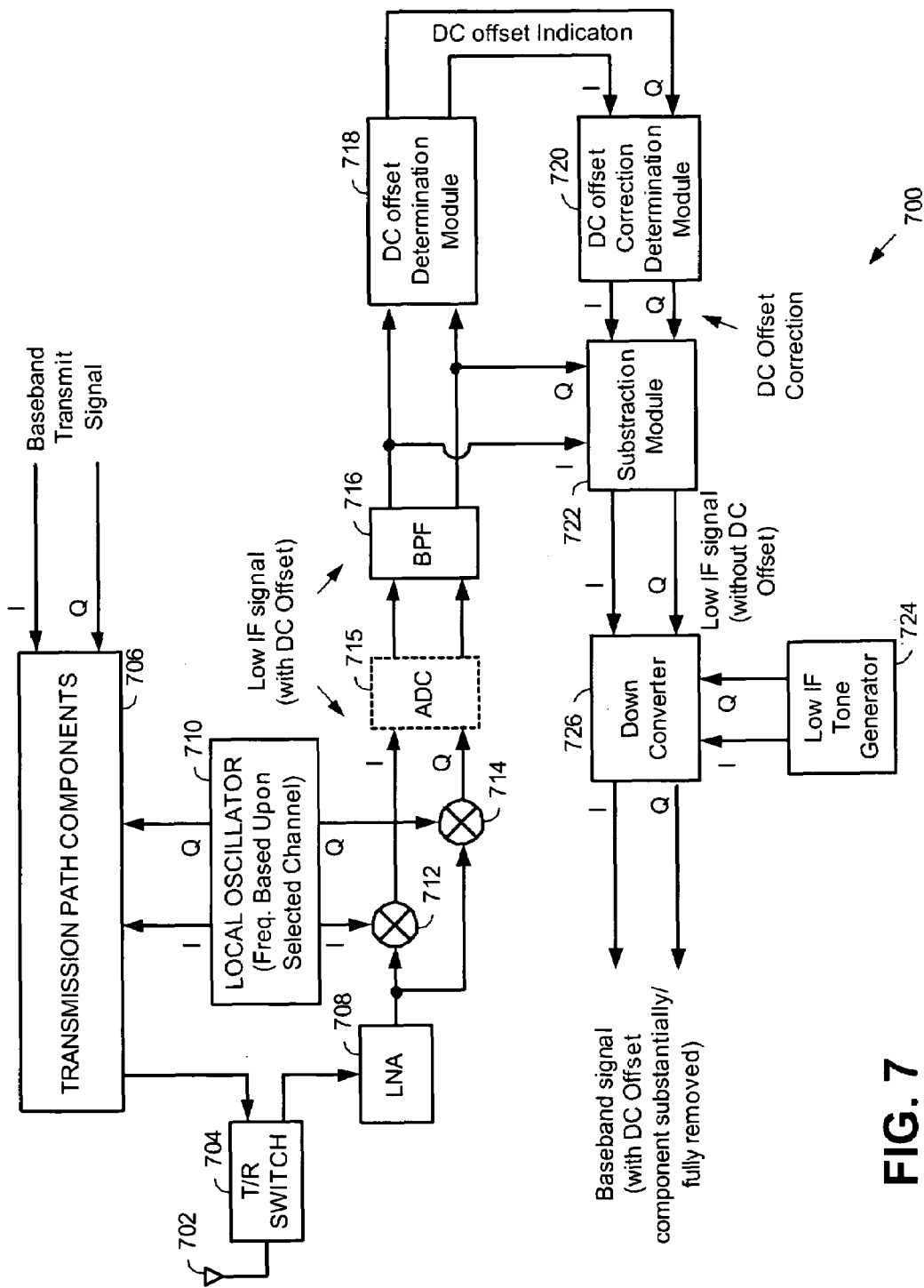
FIG. 7 is a block diagram illustrating a portion of a wireless device constructed and operating according to the embodiment of FIG. 5.

FIG. 5 is a logic diagram illustrating a method for down converting a Radio Frequency (RF) information signal to a baseband information signal according to a first embodiment the present invention. FIG. 6A is a frequency plot illustrating the spectrum of an RF signal operated upon according to the present invention. FIG. 6B is a frequency plot illustrating the spectrum of a Very Low Intermediate Frequency (VLIF) information signal produced according to the embodiment of FIG. 5. FIG. 6C is a frequency plot illustrating the spectrum of the VLIF information signal after band pass filtering and showing in detail how DC offset is removed according to the embodiment of FIG. 5. FIG. 6D is a frequency plot illustrating the spectrum of the baseband information signal of FIG. 6C after removal of the DC offset according to the embodiment of FIG. 5. FIG. 7 is a block diagram illustrating a portion of a wireless device constructed and operating according to the embodiment of FIG. 5.

FIGS. 5-7 will be referred to in describing operation according to a first embodiment of the present invention, which may be implemented by a wireless receiver, such as is contained within and services one of the wireless terminals wireless terminals 116-130 or base stations 152 and 154 of FIG. 1. Other devices that support wireless communications may implement this method as well. Referring particularly to FIG. 5, operation commences with the wireless terminal awaiting an RF burst (step 502). The wireless terminal then receives the RF information signal carried within the RF burst (step 504). The RF information signal is typically a full RF burst that corresponds to a portion of a GPRS data packet, an EDGE data packet, or another type of packet, e.g., speech packet. FIG. 6A illustrates the envelope of the RF information signal that is centered at the carrier frequency (Fc).

Referring again to FIG. 5, the RF information signal is next down converted to produce a Very Low Intermediate Frequency (VLIF) information signal centered at VLIF and having a DC offset (step 506). The VLIF information signal is optionally digitized (step 508), depending upon the structure and operations of the particular embodiment employed. Next, operation includes band pass filtering the VLIF information signal (step 510). The envelope of the VLIF information signal is illustrated particularly in FIG. 6B, along with the band pass filter characteristics. As illustrated in FIG. 6B, the VLIF information signal includes a DC offset that may have been introduced by at least one of amplification operations, filtering operations, and down conversion operations that are performed upon the information signal.

Referring again to FIG. 5, a next operation includes producing a DC offset indication for the VLIF information signal (step 512). One technique for determining the DC offset indication is averaging the VLIF information signal across a full RF burst to determine an average DC value for the VLIF information signal. The full RF burst may carry a portion of one of a GPRS data packet or an EDGE data packet and employ a GMSK constellation or an 8-PSK constellation, for example. The method next includes generating a DC offset correction based upon the DC offset indication, the DC offset correction having a DC offset correction component (step 514). FIG. 6C shows the VLIF information signal after band pass filtering with a DC offset that has been reduced by the band pass filter. Also shown in FIG. 6C is the DC offset correction, which is opposite the remaining DC offset in the VLIF information signal. Operation next includes subtracting the DC offset correction from the VLIF information signal across the RF burst to substantially remove DC offset from the post-filtered VLIF information signal (step 516). The method then includes down converting the VLIF information signal to produce a baseband information signal (step 518). Optionally, the baseband information signal may be digitized at this time (step 520). Operation completes with processing the baseband information signal to extract digital information therefrom (step 522). FIG. 6D illustrates the baseband information signal, showing that the DC offset has been removed.

In one particular embodiment of the operations of FIG. 5, the VLIF information signal is converted from an analog signal to a digital signal at step 508. In such case, band pass filtering the VLIF information signal (step 510), producing the DC offset indication (step 512), generating the DC offset correction (step 514), subtracting the DC offset correction (step 516), and down converting the VLIF information signal (step 518) are performed using digital processing operations in a base band processor, for example. Further, in this particular embodiment, down converting the RF information signal (step 506) is performed in an analog operation.

FIG. 7 is a block diagram illustrating a portion of a wireless device constructed and operating according to the embodiment of FIG. 5. Note that the components illustrated in FIG. 7 are only a portion of the components that would be present in a transceiver that supports wireless communications and in the wireless device as a whole device. The wireless device includes an antenna 702, a transmit/receive switch 704, transmission path components 706, and receiver components 700. The receiver components 700 include a low noise amplifier 708, a local oscillator 710, a mixer 712/714, a band pass filter 716, a DC offset determination module 718, a DC offset correction module 720, a subtraction module 722, a low IF tone generator 724, and a down converter 726. The local oscillator 710 is operable to produce a local oscillation. The mixer 726/728 is operable to mix the RF information signal with the local oscillation to down convert the RF information signal to produce a Very Low Intermediate Frequency (VLIF) information signal at a VLIF and having a DC offset. The band pass filter 716 is operable to band pass filter the VLIF information signal. The DC offset determination module 718 is operable to produce a DC offset indication for the VLIF information signal. The DC offset correction module 720 is operable to generate a DC offset correction based upon the DC offset indication. The subtraction module 722 is operable to subtract the DC offset correction from the VLIF information signal to substantially remove a DC offset of the post-filtered VLIF information signal. The down converter 726 is operable to down convert the VLIF information signal to a baseband information signal based upon a low IF tone generated by the low IF tone generator 724.

In one particular construct and operation, the VLIF is approximately 100 kHz. In other embodiments, however, the VLIF may be higher, e.g., 150 kHz, or lower, e.g., less than 100 kHz. Typically, the DC offset in the VLIF information signal is introduced by at least one of an amplifier, a filter, and the mixer.

In one particular operation, the DC offset determination module 718 produces the DC offset indication by averaging the VLIF information signal across a full RF burst. The full RF burst may carry a portion of one of a GPRS data packet or an EDGE data packet. When servicing an EDGE data packet the full RF burst may be modulated according to either a GMSK or an 8-PSK constellation. When servicing a GPRS data packet, the full RF burst is modulated according to the GMSK constellation.

In some embodiments, the components of the wireless receiver 700 are divided between an RF front end and a baseband processor. In such case, an Analog to Digital converter (ADC) 715 converts the VLIF information signal from an analog signal produced by the RF front end to a digital signal operated upon by the baseband processor. The ADC 715 may be located in the RF front end, in the baseband processor, or between the RF front end and the baseband processor. With this split in the structure of the wireless receiver, the local oscillator 710 and the mixer 712/714 reside within the RF front end while the band pass filter 716, the DC offset determination module 718, the DC offset correction module 720, the subtraction module 722, the low IF tone generator 724, and the down converter 726 are implemented by the baseband processor.

Figure 8:
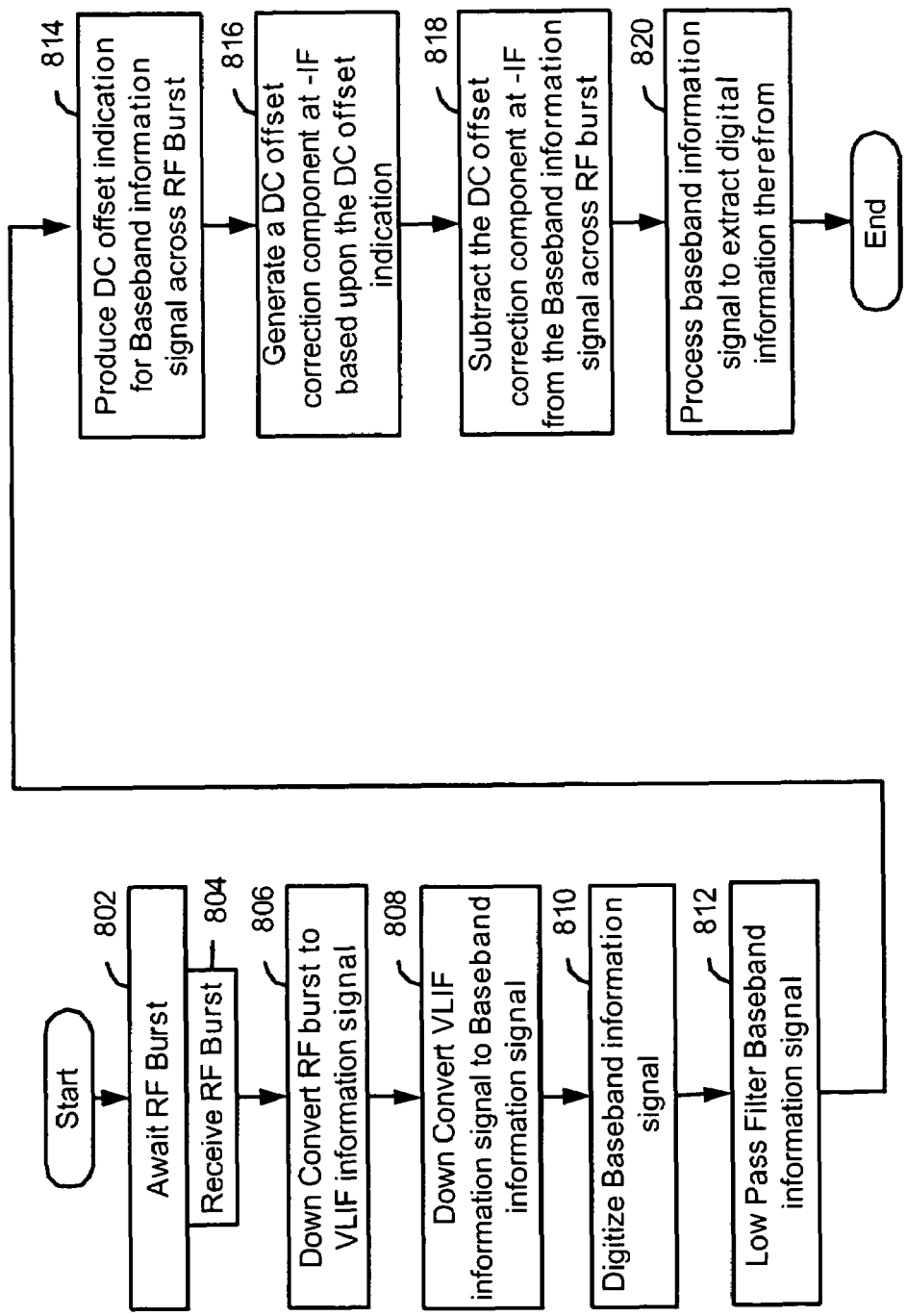
FIG. 8 is a logic diagram illustrating a method for down converting a Radio Frequency (RF) information signal to a baseband information signal according to a second embodiment of the present invention.
Figure 9:
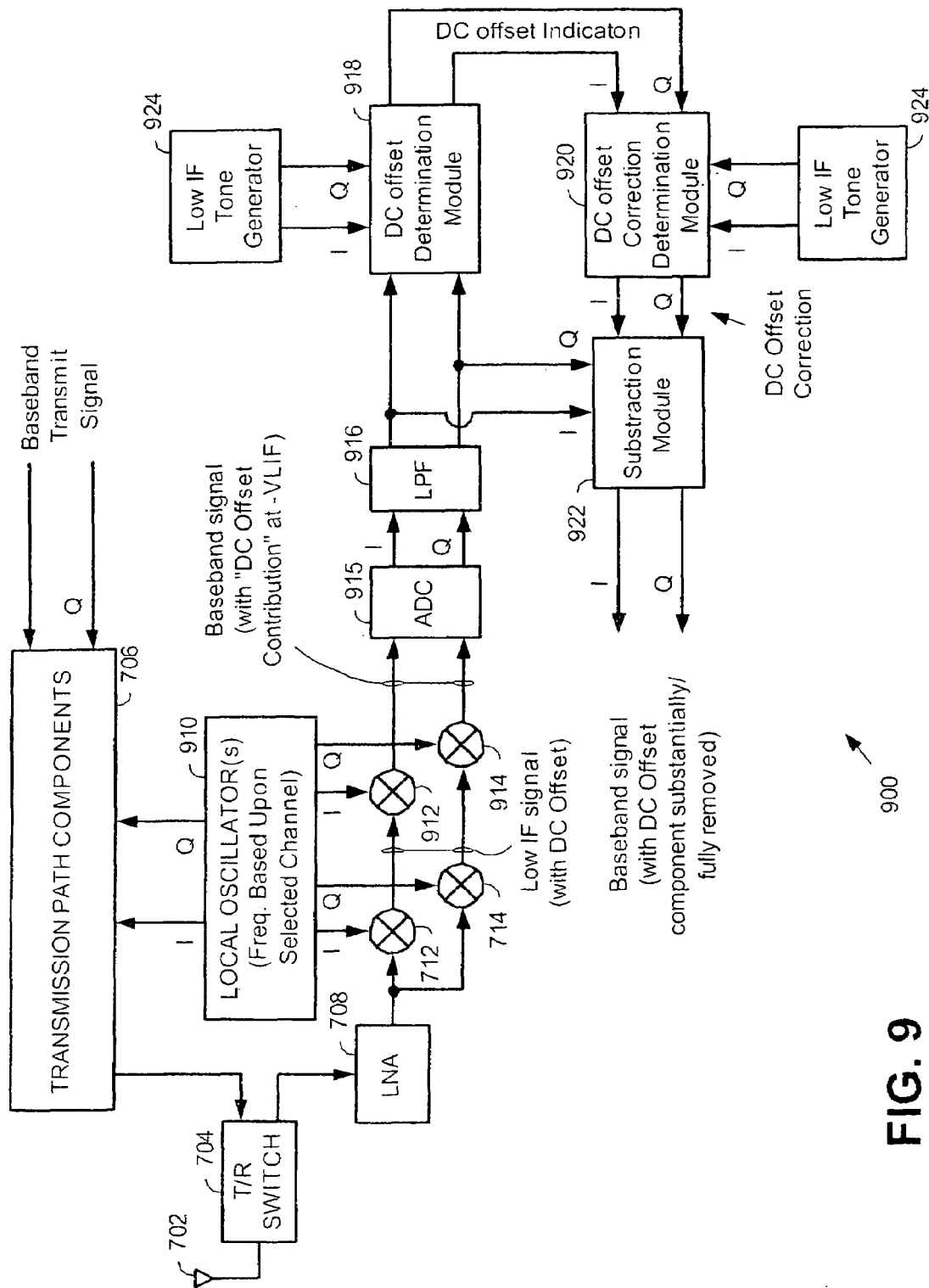
FIG. 9 is a block diagram illustrating a portion of a wireless device constructed and operating according to the embodiment of FIG. 8
Figure 10A:
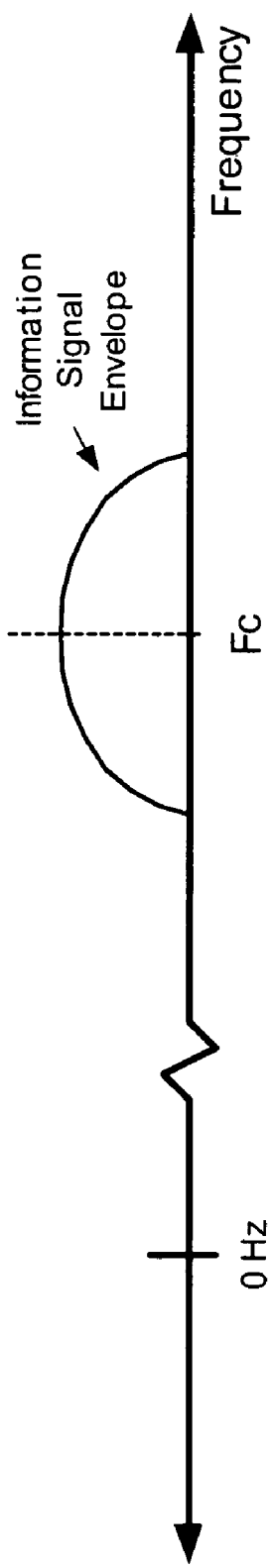
FIG. 10A is a frequency plot illustrating the spectrum of an RF signal operated upon according to the present invention.
Figure 10B:
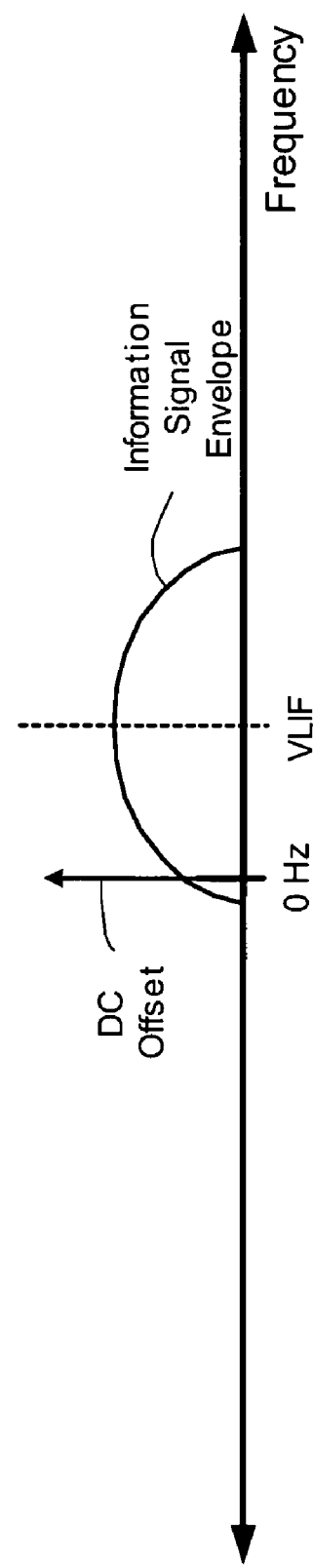
FIG. 10B is a frequency plot illustrating the spectrum of a Very Low Intermediate Frequency (VLIF) information signal produced according to the embodiment of FIG. 8.

FIG. 8 is a logic diagram illustrating a method for down converting a Radio Frequency (RF) information signal to a baseband information signal according to a second embodiment of the present invention. FIG. 9 is a block diagram illustrating a portion of a wireless device constructed and operating according to the embodiment of FIG. 8. FIG. 10A is a frequency plot illustrating the spectrum of an RF signal operated upon according to the present invention. FIG. 10B is a frequency plot illustrating the spectrum of a Very Low Intermediate Frequency (VLIF) information signal produced according to the embodiment of FIG. 8. FIG. 10C is a frequency plot illustrating the spectrum of a Baseband Information signal after low pass filtering according to the embodiment of FIG. 8. FIG. 10D is a frequency plot illustrating DC removal of the tone at –IF frequency according to the embodiment of FIG. 8. FIG. 10E is a frequency plot illustrating the spectrum of the baseband information signal of FIG. 10D after removal of the DC offset according to the embodiment of FIG. 8.

FIGS. 8-10D will be referred to in describing operation according a second embodiment of the present invention, which may be implemented by a wireless receiver, such as is contained within and services one of the wireless terminals wireless terminals 116-130 or base stations 152 and 154 of FIG. 1. Other devices that support wireless communications may implement this method as well. Referring particularly to FIG. 8, operation commences with the wireless terminal awaiting an RF burst (step 802). The wireless terminal then receives the RF information signal carried within the RF burst (step 804). The RF information signal is typically a full RF burst that corresponds to a portion of a GPRS data packet, an EDGE data packet, or another type of packet, e.g., speech packet. FIG. 10A illustrates the envelope of the RF information signal that is centered at the carrier frequency (Fc).

Referring again to FIG. 8, the RF information signal is next down converted to produce a Very Low Intermediate Frequency (VLIF) information signal centered at VLIF and having a DC offset (step 806). The envelope of the baseband information signal is illustrated particularly in FIG. 10B and is shown to have a DC offset centered at DC. The VLIF information signal is then down converted to a baseband information signal (step 808) that is subsequently digitized (step 810). FIG. 10C shows the baseband information signal with a DC offset component at –IF frequency. Next, operation includes low pass filtering the baseband information signal (step 812). The envelope of the baseband information signal is illustrated particularly in FIG. 10D, the baseband information signal including a DC offset component resident at –IF frequency that has been reduced by the low pass filter. The DC offset component was introduced by at least one of amplification operations, filtering operations, and down conversion operations that are performed upon the information signal.

Referring again to FIG. 8, a next operation includes producing a DC offset indication for the baseband information signal (step 814). One technique for determining the DC offset indication is by correlating a VLIF tone with the baseband information signal across a full RF burst to determine an average component at –IF frequency for the baseband information signal. The full RF burst may carry a portion of one of a GPRS data packet or an EDGE data packet and employ a GMSK constellation or an 8-PSK constellation, for example. The method next includes generating a DC offset correction component at –IF frequency based upon the DC offset indication (step 816).

Illustrated in FIG. 10D is the DC offset correction at –IF frequency, which is opposite the remaining DC offset contribution at –IF frequency in the baseband information signal. Referring again to FIG. 8, operation next includes subtracting the DC offset correction component at −VLIF frequency from the baseband information signal across the RF burst to substantially remove DC offset from the post-low-pass-filtered baseband information signal (step 818). Operation completes with processing the baseband information signal to extract digital information therefrom (step 820). FIG. 10E illustrates the baseband information signal, showing that the DC offset has been removed.

FIG. 9 is a block diagram illustrating a portion of a wireless device constructed and operating according to the embodiment of FIG. 8. Note that the components illustrated in FIG. 9 are only a portion of the components that would be present in a transceiver that supports wireless communications and in the wireless device as a whole device. The wireless device includes an antenna 702, a transmit/receive switch 704, transmission path components 706, and receiver components 900. The receiver components 900 include a low noise amplifier 708, a local oscillator 910, first mixers 712/714, second mixers 912/914, an Analog-to-Digital-Converter 915, a low pass filter 916, a DC offset determination module 918, a DC offset correction module 920, a low IF tone generator 924, and a subtraction module 922. The low IF tone generator 924 is shown in duplicate for simplicity in drawing structure.

The local oscillator 910 is operable to produce multiple local oscillation pairs. The mixer pair 726/728 is operable to mix the RF information signal with a first local oscillation pair to down convert the RF information signal to produce a Very Low Intermediate Frequency (VLIF) information signal that may have a DC offset. The mixer pair 912/914 is operable to mix the VLIF information signal with a second local oscillation pair to down convert the VLIF information signal to produce a baseband information signal. After the second down conversion, the DC offset that was present at DC in the VLIF signal is shifted to the −VLIF frequency.

The ADC 915 digitizes the baseband information signal. The low pass filter 916 is operable to low pass filter the baseband information signal. The DC offset determination module 918 is operable to produce a DC offset indication for the baseband information signal. The DC offset correction module 920 and the low IF tone generator, in combination, are operable to generate a DC offset correction at −VLIF frequency based upon the DC offset indication. The subtraction module 922 is operable to subtract the DC offset correction from the baseband information signal to substantially remove the DC offset at −VLIF frequency.

In one operation, the DC offset determination module 718 produces the DC offset indication by correlating a VLIF tone produced by the low IF tone generator 924 with the baseband information signal across a full RF burst. The full RF burst may carry a portion of one of a GPRS data packet or an EDGE data packet. When servicing an EDGE data packet the full RF burst may be modulated according to either a GMSK or an 8-PSK constellation. When servicing a GPRS data packet, the full RF burst is modulated according to the GMSK constellation.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

The invention claimed is:

1. A method for down converting a Radio Frequency (RF) information signal to a baseband information signal, the method comprising:
   receiving the RF information signal;
   down converting the RF information signal to produce a Very Low Intermediate Frequency (VLIF) information signal at a VLIF and having a DC offset;
   down converting the VLIF information signal to produce a baseband information signal having a DC offset component at −VLIF frequency;
   low pass filtering the baseband information signal;
   producing a DC offset indication for the baseband information signal;
   generating a DC offset correction based upon the DC offset indication, the DC offset correction having a DC offset correction component; and
   subtracting the DC offset correction at −VLIF frequency from the baseband information signal to substantially remove the DC offset component at −VLIF frequency from the baseband information signal.

2. The method of claim 1, wherein the VLIF is approximately 100 kHz.

3. The method of claim 2, wherein the DC offset of the VLIF information signal is introduced by at least one of amplification operations, filtering operations, and down conversion operations.

4. The method of claim 1, wherein the DC offset indication is produced by correlating a VLIF tone with the baseband information signal across a full RF burst.

5. The method of claim 1, wherein the DC offset indication is produced by averaging the DC offset of the VLIF information signal across a full RF burst.

6. The method of claim 5, wherein the full RF burst carries a portion of one of a GPRS data packet or an EDGE data packet.

7. The method of claim 5, wherein the full RF burst is digitally modulated according to an 8-PSK constellation.

8. The method of claim 5, wherein the full RF burst is digitally modulated according to a GMSK constellation.

9. A method for down converting a Radio Frequency (RF) information signal to a baseband information signal, the method comprising:

receiving the RF information signal;

in an analog operation, down converting the RF information signal to produce a Very Low Intermediate Frequency (VLIF) information signal at a VLIF and having a DC offset;

in an analog operation, down converting the VLIF information signal to produce a baseband information signal having a DC offset component at −VLIF frequency;

converting the baseband information signal from an analog signal to a digital signal;

in a digital operation, low pass filtering the baseband information signal;

in a digital operation, producing a DC offset indication for the baseband information signal;

in a digital operation, generating a DC offset correction based upon the DC offset indication, the DC offset correction having a DC offset correction component; and in a digital operation, subtracting the DC offset correction at −VLIF frequency from the baseband information signal to substantially remove the DC offset component at −VLIF frequency from the baseband information signal.

10. The method of claim 9, wherein the VLIF is approximately 100 kHz.

11. The method of claim 9, wherein the DC offset indication is produced by averaging the DC offset of the VLIF information signal across a full RF burst.

12. The method of claim 11, wherein the full RF burst carries a portion of one of a GPRS data packet or an EDGE data packet.

13. The method of claim 11, wherein the full RF burst is digitally modulated according to an 8-PSK constellation.

14. The method of claim 11, wherein the hill RF burst is digitally modulated according to a GMSK constellation.

15. A wireless receiver for down converting a Radio Frequency (RF) information signal to a baseband information signal, the wireless receiver comprising:

a local oscillator operable to produce a first local oscillation and a second local oscillation;

a first mixer operable to mix the RF information signal with the first local oscillation to down convert the RF information signal to produce a Very Low Intermediate Frequency (VLIF) information signal at a VLIF and having a DC offset;

a second mixer operable to mix the RF information signal with the second local oscillation to down convert the VLIF information signal to produce a baseband information signal having a DC offset component at −VLIF frequency;

a low pass filter operable to low pass filter the baseband information signal;

a DC offset determination module operable to produce a DC offset indication for the baseband information signal;

a DC offset correction module operable to generate a DC offset correction at −VLIF frequency based upon the DC offset indication; and a subtraction module operable to subtract the DC offset correction from the baseband information signal to substantially remove a DC offset component at −VLIF frequency from the baseband information signal.

16. The wireless receiver of claim 15, wherein the VLIF is approximately 100 kHz.

17. The wireless receiver of claim 15, wherein the DC offset of the VLIF information signal is introduced by at least one of an amplifier, a filter, and the mixer.

18. The wireless receiver of claim 15, wherein the DC offset indication is produced by averaging the DC offset of the VLIF information signal across a full RF burst.

19. The wireless receiver of claim 18, wherein the full RF burst carries a portion of one of a GPRS data packet or an EDGE data packet.

20. The wireless receiver of claim 18, wherein the full RF burst is digitally modulated according to an 8-PSK constellation.

21. The wireless receiver of claim 18, wherein the full RF burst is digitally modulated according to a GMSK constellation.

* * * * *

UNITED STATES PATENT AND TRADEMARK OFFICE
CERTIFICATE OF CORRECTION

| | | |
|---|---|---|
| PATENT NO. | : 7,277,688 B2 | Page 1 of 1 |
| APPLICATION NO. | : 10/811579 | |
| DATED | : October 2, 2007 | |
| INVENTOR(S) | : Baoguo Yang et al. | |

It is certified that error appears in the above-identified patent and that said Letters Patent is hereby corrected as shown below:

Column 13, line 39, in Claim 14: replace "hill" with --full--

Signed and Sealed this

Twenty-ninth Day of July, 2008

JON W. DUDAS
*Director of the United States Patent and Trademark Office*